(12) United States Patent
Ahamed et al.

(10) Patent No.: US 8,324,906 B2
(45) Date of Patent: Dec. 4, 2012

(54) METHODS FOR DETECTING A HIDDEN PEAK IN WIRE FAULT LOCATION APPLICATIONS—IMPROVING THE DISTANCE RANGE RESOLUTION

(75) Inventors: Shaik Shafi Ahamed, Bangalore (IN);
Srinivasa Rao Dangeti, Razole (IN);
Narasimha Rao Pesala, Bangalore (IN);
Thappeta Peddaiah, Bangalore (IN);
Sreenivasulu Reddy Vedicherla, Bangalore (IN); Vedagiribabu Subramanyam, Bangalore (IN);
Zhenning Liu, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 447 days.

(21) Appl. No.: 12/728,092

(22) Filed: Mar. 19, 2010

(65) Prior Publication Data
US 2011/0227582 A1 Sep. 22, 2011

(51) Int. Cl.
*G01R 31/11* (2006.01)
(52) U.S. Cl. ...................................................... 324/533
(58) Field of Classification Search .................. None
See application file for complete search history.

(56) References Cited

U.S. PATENT DOCUMENTS

| | | | |
|---|---|---|---|
| 4,538,103 A * | 8/1985 | Cappon | 324/534 |
| 7,164,274 B2 | 1/2007 | Pharn et al. | |
| 7,165,200 B2 * | 1/2007 | Jani et al. | 714/724 |
| 7,245,129 B2 | 7/2007 | Wajcer et al. | |
| 7,548,071 B2 * | 6/2009 | Harrison et al. | 324/617 |
| 7,868,621 B2 * | 1/2011 | Liu et al. | 324/512 |
| 2005/0289408 A1 * | 12/2005 | Jani et al. | 714/712 |
| 2006/0181283 A1 * | 8/2006 | Wajcer et al. | 324/539 |
| 2009/0228223 A1 * | 9/2009 | Liu et al. | 324/527 |
| 2011/0181295 A1 * | 7/2011 | Haugen et al. | 324/543 |
| 2012/0176607 A1 * | 7/2012 | Ott | 356/73.1 |

OTHER PUBLICATIONS

Lo, Chet and Furse, Cynthia, "Noise-domain reflectometry for locating wiring faults", IEEE Transactions on Electromagnetic Compatibility, vol. 47, No. 1, pp. 97-104, Feb. 2005.

* cited by examiner

*Primary Examiner* — Jermele M Hollington
(74) *Attorney, Agent, or Firm* — Shimokaji & Assoc., PC (57) ABSTRACT

Hidden or overlapped peaks may occur when using SSTDR technology to determine ware faults. These hidden/overlapped peaks may cause false negative determinations (no fault) when testing a wire for faults. In one method of the present invention, the symmetrical property of the SSTDR wave envelope is used to resolve hidden/overlapped peaks. In another method of the present invention, the calibrated normalized loop back SSTDR wave envelope may be used to resolve hidden/overlapped peaks.

16 Claims, 8 Drawing Sheets

METHODS FOR DETECTING A HIDDEN PEAK IN WIRE FAULT LOCATION APPLICATIONS—IMPROVING THE DISTANCE RANGE RESOLUTION

BACKGROUND OF THE INVENTION

The present invention relates to methods and apparatus for detecting hidden peaks in wire fault location technologies and, more particularly, to methods for resolving overlapping and/or hidden peaks detected through spread spectrum time domain reflectometry (SSTDR).

Aircraft wiring problems have recently been identified as the likely cause of several tragic mishaps and hundreds of thousands of lost mission hours. Aircraft wiring is often routed behind panels or wrapped in special protective jackets and is not accessible, even during heavy maintenance when most of the panels are removed. A wire testing method that could test the wires continually, including while the plane is in flight would, therefore, have a tremendous advantage over conventional static test methods.

Various technologies in detecting and pin-pointing the wiring problems have been proposed and developed to address safety concerns, among which, spread spectrum time domain reflectometry (SSTDR) has received particular attention. SSTDR has demonstrated its potential as an effective way of locating intermittent faults on aircraft wires during flight.

Figure 1:
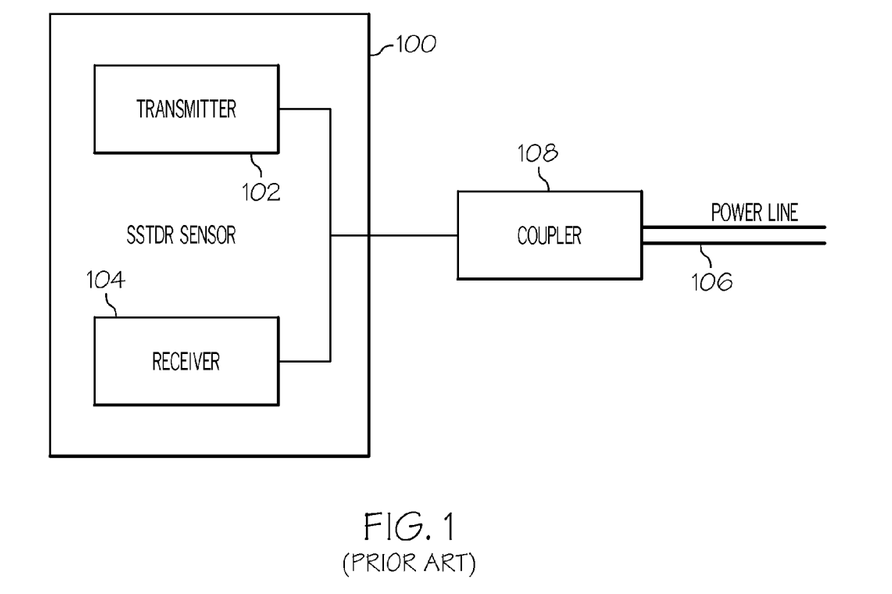
FIG. 1 is a block diagram of a conventional SSTDR sensor coupled to a power line.

In an advanced aircraft power distribution system, each section of the power bus and the feeder wires for every electric load is protected from the thermal (over current) stress by either a smart contactor or a remote power controller (RPC). Each of these over current options are equipped with certain level of intelligence to perform required functions, such as bus switching and load controls, bus and feeder wire over current protections, and arc fault detection (AFD). Therefore, in order to achieve comprehensive aircraft wiring integrity monitoring and fault location determination, the individual smart contactor or RPC becomes the perfect platform to incorporate an SSTDR sensor. FIG. 1 shows a conventional SSTDR sensor 100 having a transmitter 102 and a receiver 104 therewithin. The SSTDR sensor 100 may be connected to a power line 106 via a coupler 108.

The SSTDR technology for wire fault location determination follows the radar principle to identify the location of a fault. A modulated pulse signal is sent through a wire by the transmitter 102. The reflected signal due to a wire fault is then captured and decoded by the receiver 104. The distance from the wire fault location to the source of the original pulse signal is determined via timing of the return of the reflection relative to the original pulse and the speed of signal propagation inside the wire.

However, if under certain circumstances, the reflected signal overlaps with the original test signal, the determination of the timing of the return of the reflection relative to the original pulse becomes very difficult. The following two scenarios are described to illustrate these difficulties.

Figure 2:
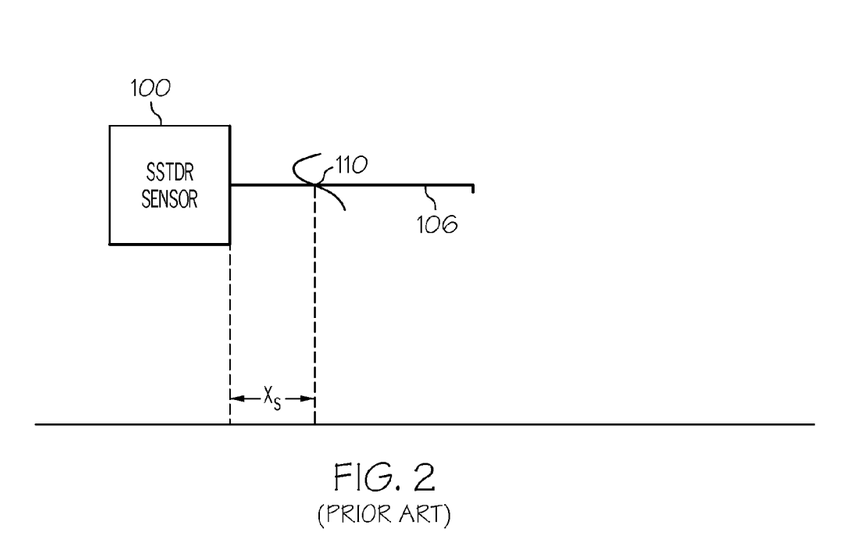
FIG. 2 is a block diagram showing a wire fault occurring within the resolution of a conventional SSTDR sensor, resulting in a hidden fault peak.

As shown in FIG. 2, when a fault 110 occurs at a location close to the range resolution, X, of the sensor 100, which is determined by the bandwidth of the sensor test signal, the reflected signal peak from the wire fault will be hidden in the transmitted loop back signal. In this case sensor might conclude a "no fault find".

Figure 3:
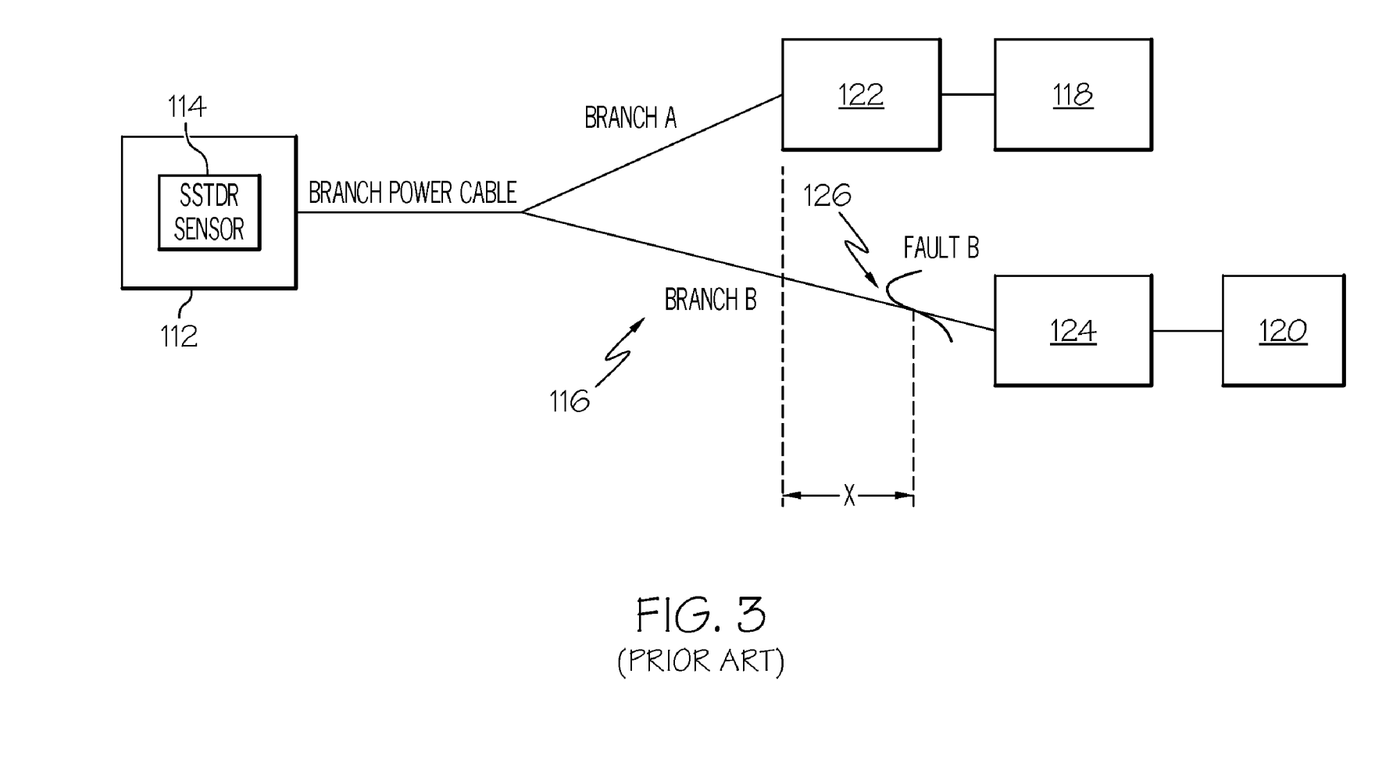
FIG. 3 is a block diagram showing a wire fault occurring on a branched network of a conventional SSTDR sensor, resulting in a hidden fault peak.

As shown in FIG. 3, in a practical aircraft power distribution system, a primary remote power controller 112 with a built-in SSTDR sensor 114 may be used to control a branched feeder network 116 to supply power to two electric loads 118, 120 controlled by two secondary (or downstream) RPCs 122, 124. If the distance between the RPC 112 and the RPC 122 is about the same as the distance between the RPC 112 and the location of the wire fault 126, the reflected signal peak due to the RPC 122 connection from branch A may overlap with that due to the wire fault 126 from branch B, leading to a false conclusion from the SSTDR sensor 114 that there is "no fault find".

As can be seen, the range resolution of a SSTDR sensor depends on how closely a SSTDR sensor algorithm can resolve the two signal peaks when they are separated by small distance or overlapped with each other. If the hidden/overlapped peak issue is not properly resolved, a legitimate wire fault could be overlooked.

As can be seen, there is a need for a SSTDR wire fault method that is capable of resolving hidden/overlapped peaks.

SUMMARY OF THE INVENTION

In one aspect of the present invention, a method for detecting a wire fault in a power cable comprises sending a test signal from a spread spectrum time domain reflectometry (SSTDR) sensor along the power line; receiving a reflected signal, the reflected signal resulting from the test signal being reflected from the wire fault back to the SSTDR sensor; subtracting data points of a left hand side of the reflected signal from a right hand side of the reflected signal; and resolving any peaks hidden in the reflected signal.

In another aspect of the present invention, a method for detecting a wire fault in a power cable comprises calibrating a spread spectrum time domain reflectometry (SSTDR) sensor by receiving a correlated envelope of a loop back signal without connecting the SSTDR sensor to the power cable; sending a test signal from the SSTDR sensor along the power line; receiving a reflected signal, the reflected signal resulting from the test signal being reflected from the wire fault back to the SSTDR sensor; subtracting data points of the correlated envelope from the reflected signal; and resolving any peaks hidden in the reflected signal.

In a further aspect of the present invention, a device for detecting a wire fault in a power cable comprises a transmitter operable to send a signal along a power line; a receiver operable to receive a reflected signal, the reflected signal being either a reflected from the wire fault in the power cable or a loop back signal; and a hidden peak detection unit operable to resolve a peak due to the reflected signal hidden in a loop back signal from the transmitter, wherein the hidden peak detection unit operable to subtract at least one of a correlated envelope of the loop back signal or a left hand side of the reflected signal from a right hand side of the reflected signal to resolve the hidden peak.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention provide methods for detecting hidden/overlapped peaks that may occur when using SSTDR technology to determine ware faults. These hidden/overlapped peaks may cause false negative determinations (no fault) when testing a wire for faults. In one method according to an exemplary embodiment of the present invention, the symmetrical property of the SSTDR wave envelope is used to resolve hidden/overlapped peaks. In another method according to another exemplary embodiment of the present invention, the calibrated normalized loop back SSTDR wave envelope may be used to resolve hidden/overlapped peaks.

Figure 4:
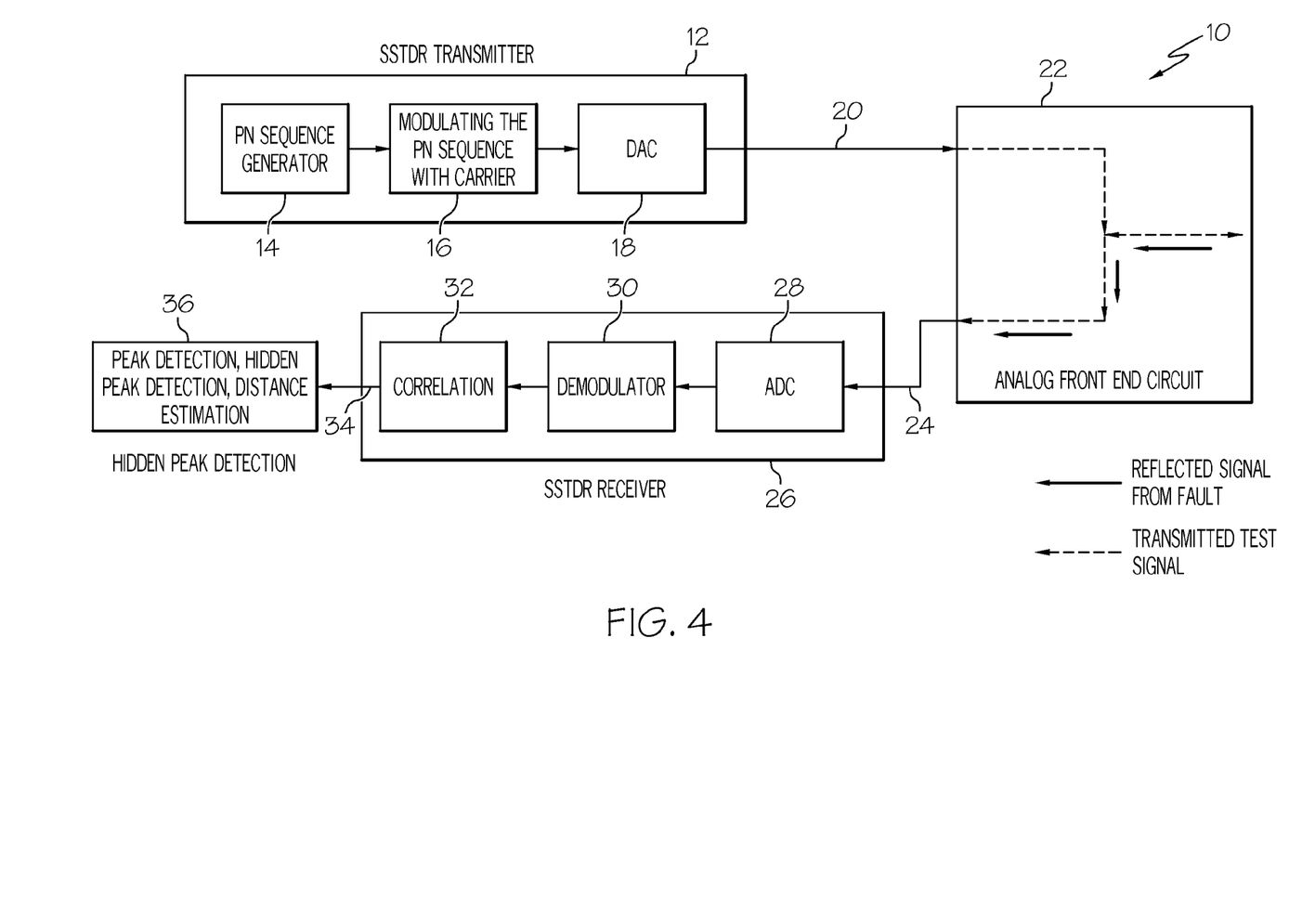
FIG. 4 is a block diagram of a SSTDR sensor to provide a signal processed by methods of the present invention.

Referring to FIG. 4, in an SSTDR sensor 10 according to an embodiment of the present invention, an SSTDR transmitter 12 include a pseudo-random noise (PN) sequence generator 14, a modulator 16 for modulating the PN sequence with a carrier, and a digital to analog converter (DAC) 18 to provide a signal 20 from the SSTDR transmitter 12. The signal 20 may pass through an analog front end circuit 22 to send a test signal onto a power line (not shown).

A reflected signal 24 may be received by a conventional SSTDR receiver 26. The receiver may include an analog to digital converter (ADC) 28, a demodulator 30 and a correlator 32 for providing an output signal 34 (also referred to as a matched filter output). The output signal 34 may be processed by a hidden peak detection unit 36, which may provide hidden peak detection, according to methods of the present invention.

In general, the range resolution and accuracy of the SSTDR 10 may be decided by the bandwidth of the signal 20 and sampling rate. The receiver 26 may sample the received signal 24 (combined signal, transmitted plus reflected from a fault location) and perform the demodulation to extract the baseband signal. The correlator 32, or matched filtering, may be employed in case of a SSTDR/STDR which uses Direct Sequence Spread Spectrum (DSSS). The correlator/matched filter output 34 (correlation peaks) may be in the form of samples which may be sampled at a predetermined sampling rate, Fs, which may decide the time scale accuracy of the SSTDR 10.

One task of a peak detection algorithm (such as that used in peak detection unit 36) may be to extract the delay from received signal 24. This delay may be related to the time taken to for the test signal 20 to travel from the SSTDR 10 to a fault location and then return to the SSTDR 10. The matched filter output 34 may have two signatures (correlation peaks). One peak may be due to a loop back signal, as is known in the art, and the second peak may be due to a reflected signal. If the fault is above the sensor resolution range, then the two signatures may be separated by a considerable distance and can be resolved easily and estimate the delay. When the two signatures overlap, however, one of the methods of the present invention may be used to resolve the hidden peak and estimates the delay. Fault location may be computed from delay and velocity of the propagation (VOP).

Figure 5:
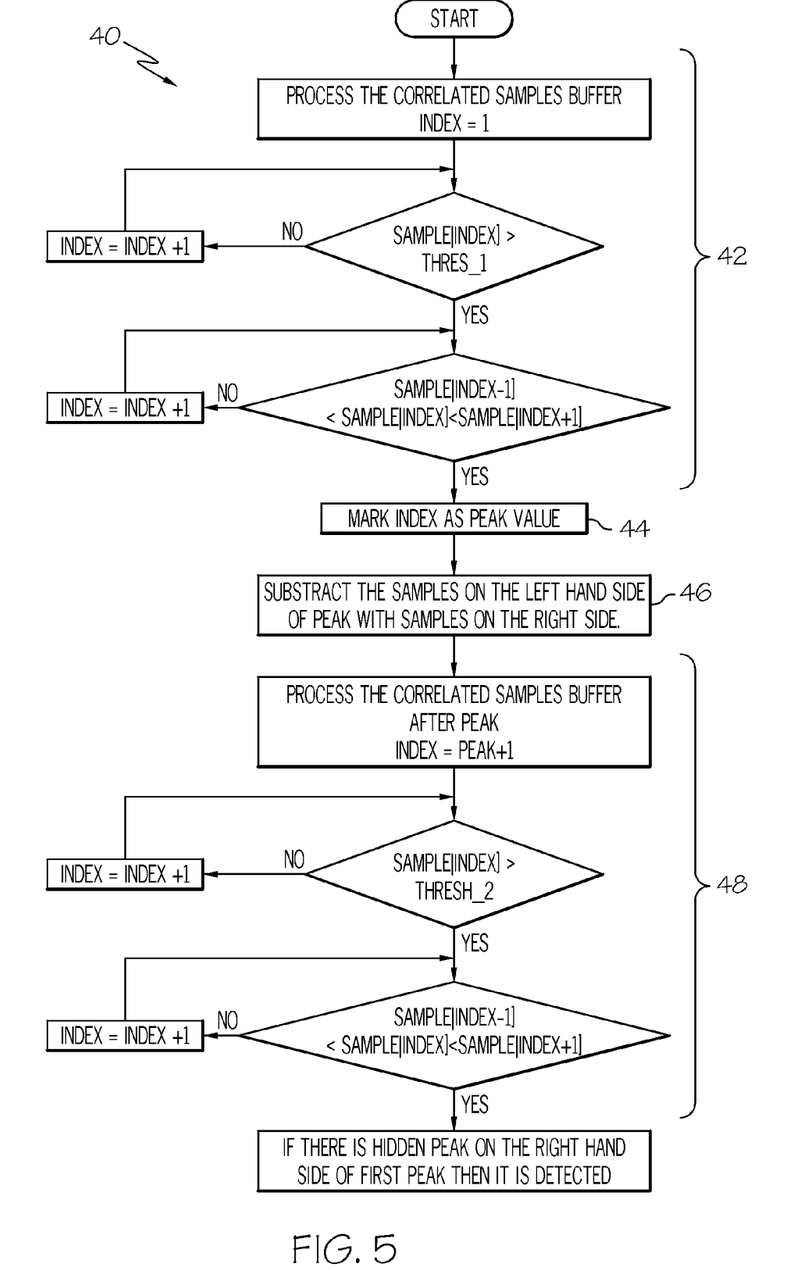
FIG. 5 is a flow chart generally following a method according to an embodiment of the present invention.

Referring to FIG. 5, in a first method 40 according to an embodiment of the present invention, a hidden peak may be detected using the symmetrical property of the envelope/correlated output. When the peak is detected, the data points from the left hand side (LHS) of the peak may be subtracted from the right hand side (RHS) of the peak. If there is a hidden peak, after performing the above operation, it may be resolved.

More specifically, the method 40 may include steps 42 for obtaining a suitable sample from a SSTDR receiver, e.g., receiver 26. The steps 42 may result in an index being assigned as a peak value at step 44. The samples on the left hand side of the peak may be subtracted from the samples on the right hand side of the peak at step 46. The result of the subtraction in step 46 may be processed by steps 48 to determine the presence of a hidden peak on the right hand side of the first peak found in steps 42.

Figure 7A:
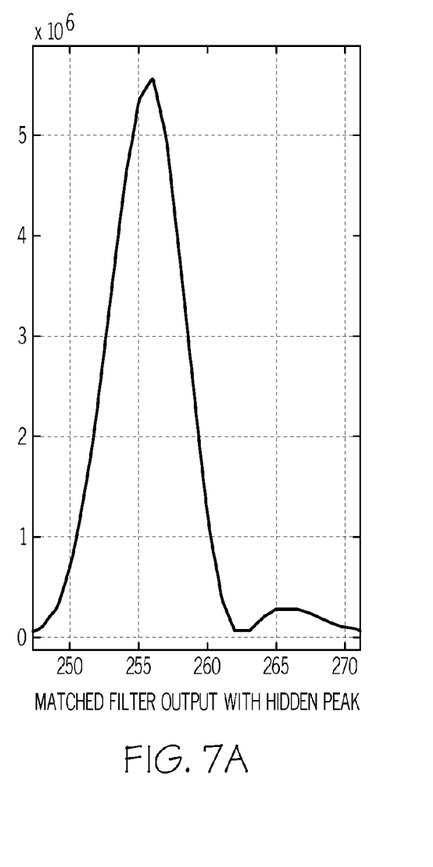
FIG. 7A is a graph showing a simulated SSTDR output signal with a hidden peak according to a comparative example.
Figure 7B:
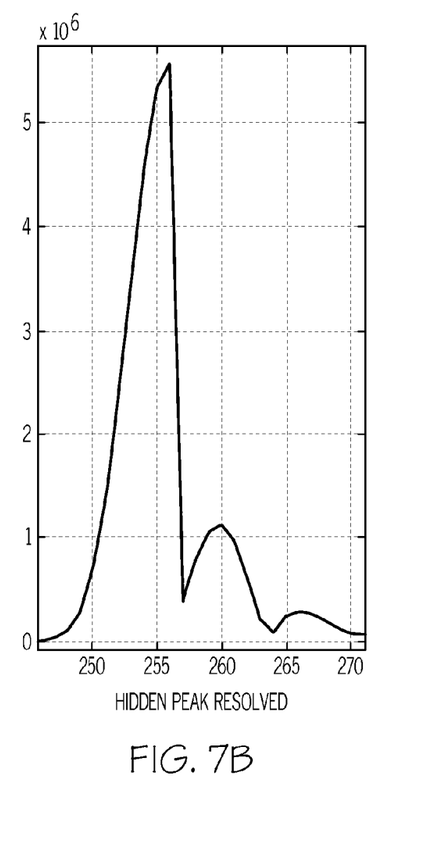
FIG. 7B is a graph showing a simulated SSTDR output signal with a hidden peak resolved, according to an embodiment of the present invention.
Figure 8:
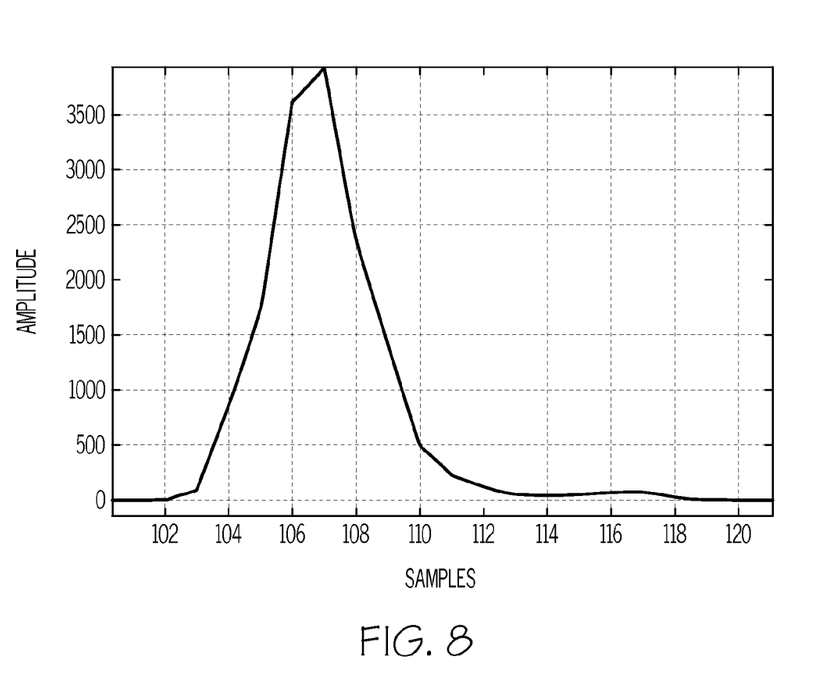
FIG. 8 is a graph showing real time SSTDR data based on the simulation of FIG. 4A, with a hidden peak according to another comparative example.
Figure 9:
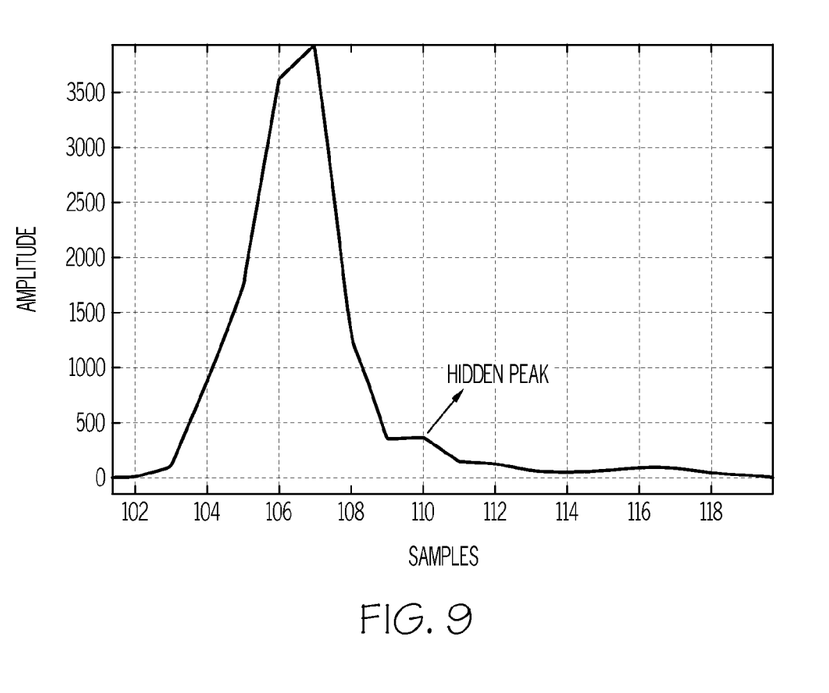
FIG. 9 is a graph showing real time SSTDR data based on the simulation of FIG. 4B, with a hidden peak resolved, according to an embodiment of the present invention.

As shown in FIGS. 7A, 7B, 8 and 9, the method 40 may resolve hidden peaks from a reflected SSTDR signal. More specifically, FIG. 7A shows a simulation of a comparative example, showing data that may be interpreted by a conventional SSTDR as "no fault" data. FIG. 7B shows the same simulation from FIG. 7A, but with the application of method 40. With the simulated data of FIGS. 7A and 7B, it can be seen how the method 40 may resolve a hidden peak and may prevent a false negative report of no fault. FIG. 8 shows real time data from a conventional SSTDR without the application of the methods of the present invention. Similar to the simulation of FIG. 7A, the data of FIG. 8 may be interpreted by a conventional SSTDR as "no fault" data. FIG. 9 shows real time data of the same fault of FIG. 8, but with the application of method 40. As can be seen from FIG. 9, the application of method 40 of the present invention may resolve a hidden peak and may prevent a false negative report of no fault.

Figure 6:
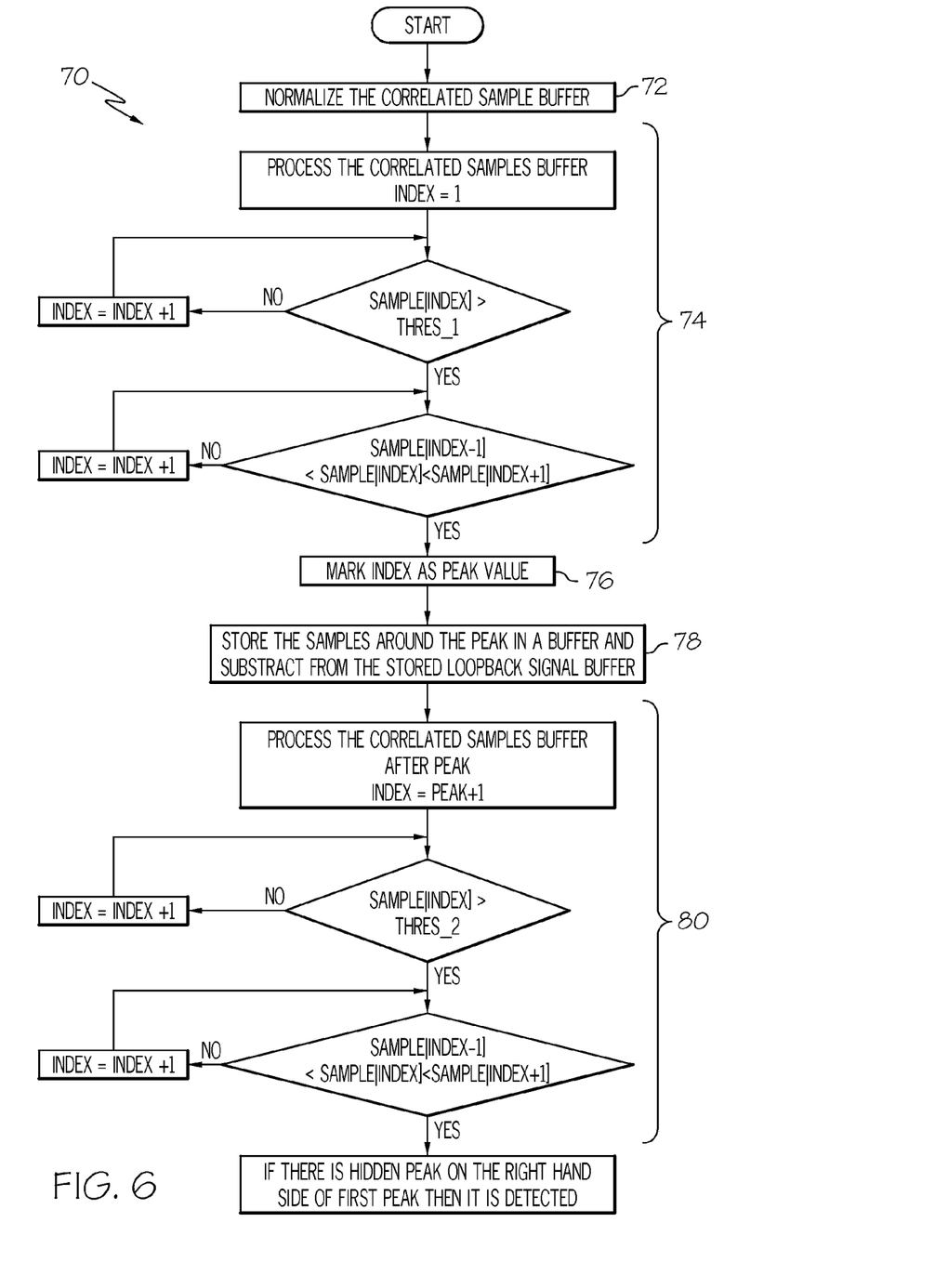
FIG. 6 is a flow chart generally following a method according to another embodiment of the present invention.
Figure 10:
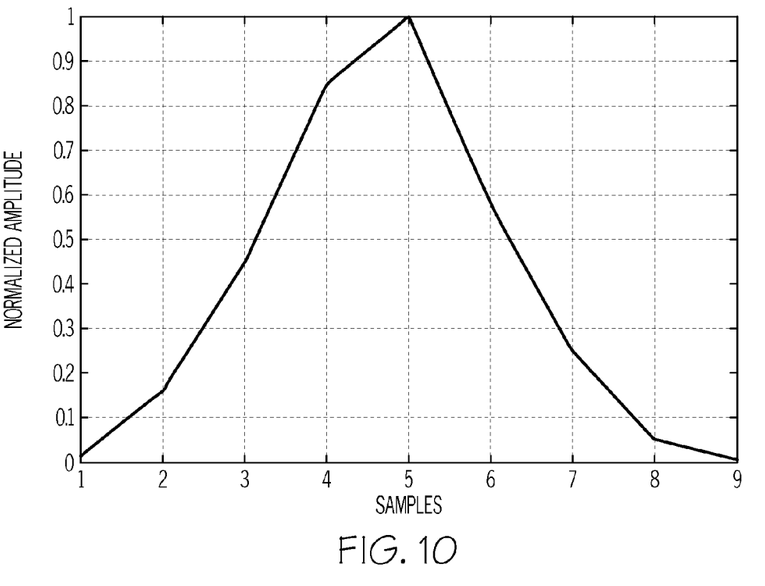
FIG. 10 is a graph of a stored normalized loop back peak envelope, according to an alternate embodiment of the present invention.

Referring to FIG. 6, in a second method 70, the SSTDR sensor may be calibrated by storing the correlated envelope of the loop back signal without connecting the SSTDR to the power cable. The received correlator envelope (predefined window) may be normalized and stored in the memory, as shown in FIG. 10. When the reflected peak is received due to the fault, the normalized reflected peak envelope may be subtracted from the predefined stored data. This method may remove the detectable peak and reveal a hidden peak. Hence the distance of the fault along the power cable can be estimated.

More specifically, the method 70 may include a step 72 of normalizing a correlated sample buffer to provide a stored normalized loop back peak envelope as shown in FIG. 10. This step 72 may be carried out before the SSTDR is connected to a power cable that may have a wire fault. In steps 74, a suitable sample may be obtained from a SSTDR receiver, e.g., receiver 26. The steps 74 may result in an index being assigned as a peak value at step 76. In step 78, the stored normalized loop back peak envelope created in step 72 may be subtracted from the peak sampled in steps 74. The result of the subtraction in step 76 may be processed by steps 80 to determine the presence of a hidden peak on the right hand side of the first peak found in steps 74.

Figure 11A:
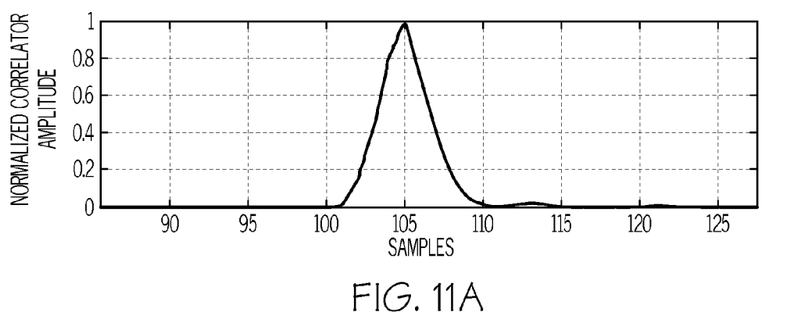
FIG. 11A is a graph showing real time SSTDR data based with a hidden peak according to a comparative example.
Figure 11B:
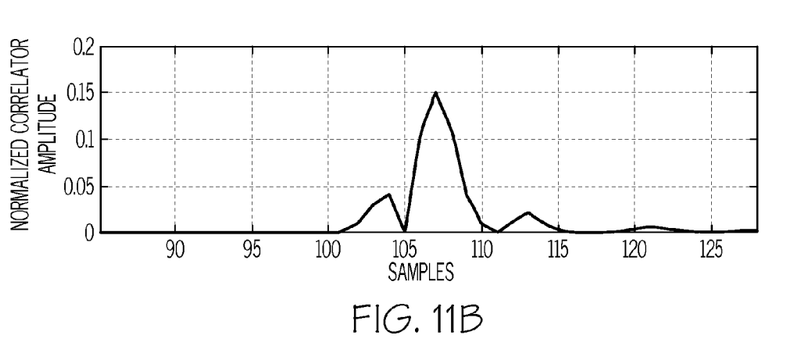
FIG. 11B is a graph showing real time SSTDR data with a hidden peak resolved, according to another embodiment of the present invention.

FIG. 11A shows real time data from a conventional SSTDR without the application of the method 70 of the present invention. The data from FIG. 11A may be interpreted incorrectly by a conventional SSTDR as "no fault" data. FIG. 11B shows real time data of the same fault of FIG. 11A, but with the application of method 70. As can be seen from FIG. 11B, the application of method 70 of the present invention may resolve a hidden peak and may prevent a false negative report of no fault.

Either one or both of the above described methods 40, 70 may be used in selected embodiments of the present invention. When both methods 40, 70 are used to analyze a reflected signal sent from a SSTDR, a first hidden peak output may be provided by the method 40 and a second hidden peak output may be provided by the method 70. Each of the first and second hidden peak outputs may be analyzed separately to determine the presence of hidden peaks in the reflected signal. Embodiments of the present invention may require minimum computational power to resolve the hidden peak when it is overlapped with the transmitter loop back signal.

It should be understood, of course, that the foregoing relates to exemplary embodiments of the invention and that modifications may be made without departing from the spirit and scope of the invention as set forth in the following claims.

We claim:

1. A method for detecting a wire fault in a power cable, the method comprising:
   sending a test signal from a spread spectrum time domain reflectometry (SSTDR) sensor along the power cable;
   receiving a reflected signal, the reflected signal resulting from the test signal being reflected from the wire fault back to the SSTDR sensor;
   assigning an index as a peak value of the reflected signal so that the reflected signal has a first portion occurring prior in time to occurrence of the peak value and a second portion occurring later in time than the peak value portion;
   subtracting data points of the first portion of the reflected signal from data points of the second portion of the reflected signal; and
   resolving any peaks hidden in the reflected signal.

2. The method of claim 1, further comprising outputting correlation peaks from a correlator of a receiver of the SSTDR sensor prior to the subtracting step.

3. The method of claim 2, wherein the correlator outputs two correlation peaks, including a first correlation peak, occurring at a first time, being associated with a loop back signal from the SSTDR sensor, and a second correlation peak, occurring at a second, later time, being associated with the reflected signal.

4. The method of claim 3, further comprising determining a location of the wire fault by determining a time delay between the first time and the second time.

5. The method of claim 1, wherein the wire fault is located within a resolution of the SSTDR sensor.

6. The method of claim 1, wherein the wire fault is located in a branched feeder network having multiple remote power controllers.

7. The method of claim 1, further comprising:
   calibrating the spread spectrum time domain reflectometry (SSTDR) sensor by receiving a correlated envelope of a loop back signal without connecting the SSTDR sensor to the power cable;
   subtracting data points of the correlated envelope from the reflected signal; and
   resolving any additional peaks hidden in the reflected signal.

8. The method of claim 7, further comprising normalizing the correlated envelope and storing the normalized correlated envelope in memory.

9. A method for detecting a wire fault in a power cable, the method comprising:
   calibrating a spread spectrum time domain reflectometry (SSTDR) sensor by receiving a correlated envelope of a loop back signal without connecting the SSTDR sensor to the power cable;
   sending a test signal from the SSTDR sensor along the power cable;
   receiving a signal, the received signal resulting from the test signal being the loopback signal and associated reflected signal or reflected signal from one or more wire faults back to the SSTDR sensor;
   subtracting data points of the correlated envelope of the loop back signal from the received signal; and
   resolving any peaks hidden in the received signal.

10. The method of claim 9, further comprising normalizing the correlated envelope and storing the normalized correlated envelope in memory.

11. The method of claim 9, further comprising:
    outputting correlation peaks from a correlator of a receiver of the SSTDR sensor prior to the subtracting step, wherein
    the correlator outputs two correlation peaks, a first correlation peak, occurring at a first time, being associated with a loop back signal from the SSTDR sensor and the second correlation peak, occurring at a second, later time, being associated with the reflected signal resulting from the test signal being reflected from the wire fault.

12. The method of claim 11, further comprising determining a location of the wire fault by determining a time delay between the first time and the second time.

13. The method of claim 9, wherein the wire fault is located within a resolution of the SSTDR sensor.

14. The method of claim 9, wherein the wire fault is located in a branched feeder network having multiple remote power controllers.

15. A device for detecting a wire fault in a power cable, the device comprising:
    a transmitter configured to send a signal along a power cable;
    a receiver configured to receive a signal, the received signal being a combination of a reflected signal from the wire fault in the power cable and a loop back signal; and a hidden peak detection unit configured to resolve a peak due to the reflected signal hidden in the loop back signal from the transmitter, wherein the hidden peak detection unit is configured to subtract at least one of a correlated envelope of the loop back signal from the received signal or a first portion of the received signal occurring prior in time to occurrence of a peak value of said signal from a second portion of said signal occurring later in time than the peak value to resolve the hidden peak.

16. The device of claim 15, wherein the transmitter and the receiver are components of a spread spectrum time domain reflectometry (SSTDR) sensor.

\* \* \* \* \*